US 8,243,256 B2

(12) United States Patent
Suzuki et al.

(10) Patent No.: US 8,243,256 B2
(45) Date of Patent: Aug. 14, 2012

(54) MEASUREMENT APPARATUS FOR MEASURING AN ABERRATION OF AN OPTICAL SYSTEM, MEASUREMENT METHOD, EXPOSURE APPARATUS, AND DEVICE FABRICATION METHOD

(75) Inventors: Takeshi Suzuki, Utsunomiya (JP); Yoshiyuki Kuramoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 500 days.

(21) Appl. No.: 12/469,586

(22) Filed: May 20, 2009

(65) Prior Publication Data
US 2009/0296059 A1 Dec. 3, 2009

(30) Foreign Application Priority Data
May 21, 2008 (JP) .................................. 2008-133546

(51) Int. Cl.
*G03B 27/68* (2006.01)
*G03B 27/52* (2006.01)
*G03B 27/32* (2006.01)
(52) U.S. Cl. ................ 355/52; 355/55; 355/77
(58) Field of Classification Search .............. 355/52, 355/55, 77
See application file for complete search history.

(56) References Cited

U.S. PATENT DOCUMENTS

| 5,420,436 | A  | * | 5/1995  | Seya et al. ................ 250/492.1 |
| 6,633,362 | B2 |   | 10/2003 | Murakami et al. |
| 6,937,345 | B2 |   | 8/2005  | Kuramoto |
| 2002/0191195 | A1 | | 12/2002 | Ichihara et al. |

FOREIGN PATENT DOCUMENTS

| JP | 2000-277411 A    | 10/2000 |
| JP | 2002-022608 A    | 1/2002  |
| KR | 10-2008-0036927 A | 4/2008  |

* cited by examiner

*Primary Examiner* — Toan Ton
*Assistant Examiner* — Michelle Iacoletti
(74) *Attorney, Agent, or Firm* — Canon U.S.A., Inc., IP Division

(57) ABSTRACT

The present invention provides a measurement apparatus which measures a wavefront aberration of a measurement target optical system, the apparatus including a fringe scanning unit configured to perform fringe scanning by changing a phase difference between test light and reference light, a determination unit configured to determine a nonlinear error representing a nonlinear change in feature amount, which is derived from an interference pattern between the test light and the reference light, with respect to predetermined control data by performing fringe scanning by the fringe scanning unit in accordance with the control data in a plurality of phase states, and a correction unit configured to correct, based on the nonlinear error determined by the determination unit, a wavefront aberration of the measurement target optical system calculated from the interference pattern between the test light and the reference light.

8 Claims, 4 Drawing Sheets

MEASUREMENT APPARATUS FOR MEASURING AN ABERRATION OF AN OPTICAL SYSTEM, MEASUREMENT METHOD, EXPOSURE APPARATUS, AND DEVICE FABRICATION METHOD

BACKGROUND OF THE INVENTION

1. Field of the Invention

The present invention relates to a measurement apparatus, a measurement method, an exposure apparatus, and a device fabrication method.

2. Description of the Related Art

In recent years, a projection optical system (projection lens) mounted in a projection exposure apparatus is required to have a performance as high as a wavefront aberration (transmitted wavefront aberration) of 10 m$\lambda$ RMS or less (a wavelength $\lambda$=248 nm, 193 nm, and so on). This has made it necessary to accurately measure the wavefront aberration of the projection optical system (on the order of about 1 m$\lambda$).

It is a common practice to use an interferometer to measure the wavefront aberrations of the projection optical system on a plurality of wavefronts in its field of view. Especially a Fizeau interferometer, for example, allows high-accuracy wavefront measurement by the fringe scanning method because it includes a piezoelectric element which moves, in the optical axis direction of the projection optical system, an optical element (for example, a TS lens) which splits light from a light source into test light and reference light. The projection optical system is adjusted so as to minimize aberration coefficients obtained by polynomial expansion of the wavefronts measured by the interferometer (e.g., expansion in a series of Zernike functions).

Japanese Patent Laid-Open Nos. 2000-277411 and 2002-22608 propose details of this technique.

Unfortunately, a piezoelectric element which performs fringe scanning does not always have a strictly linear response characteristic, so the moving velocity of the optical element often does not become constant (i.e., the movement of the optical element often does not become linear with respect to time) even when the driving voltage applied to the piezoelectric element is changed linearly. If such a change in the moving velocity of the optical element (to be referred to as "fringe scanning nonlinearity" hereinafter) remains until measurement, an error is included in the measured wavefront (i.e., a measurement error occurs).

Also, it is indeed possible to measure the average phase in each bucket during fringe scanning based on electronic moiré to obtain the response characteristic of the piezoelectric element, thereby controlling the driving voltage applied to the piezoelectric element so as to maintain the moving velocity of the optical element constant. However, a commonly-used CCD camera cannot perform fine sampling owing to constraints of, for example, the number of buckets and the frame rate. This makes it impossible to obtain the response characteristic of the piezoelectric element with sufficient accuracy. It is therefore very difficult to control the driving voltage applied to the piezoelectric element so as to maintain the moving velocity of the optical element constant in practice.

SUMMARY OF THE INVENTION

The present invention provides a measurement apparatus which can accurately measure the wavefront aberration of a measurement target optical system (projection optical system).

According to one aspect of the present invention, there is provided a measurement apparatus which measures a wavefront aberration of a measurement target optical system, the apparatus including an optical element which is arranged on a side of an object plane of the measurement target optical system, and configured to split light from a light source into test light and reference light, a generation unit configured to generate a plurality of phase states by changing a phase difference between the test light and the reference light, a fringe scanning unit configured to perform fringe scanning by changing the phase difference between the test light and the reference light, a determination unit configured to determine a nonlinear error representing a nonlinear change in feature amount, which is derived from an interference pattern between the test light and the reference light, with respect to predetermined control data by performing fringe scanning by the fringe scanning unit in accordance with the control data in the plurality of phase states generated by the generation unit, and a correction unit configured to correct, based on the nonlinear error determined by the determination unit, a wavefront aberration of the measurement target optical system calculated from the interference pattern between the test light and the reference light.

Further features of the present invention will become apparent from the following description of exemplary embodiments with reference to the attached drawings.

DESCRIPTION OF THE EMBODIMENTS

Figure 1:
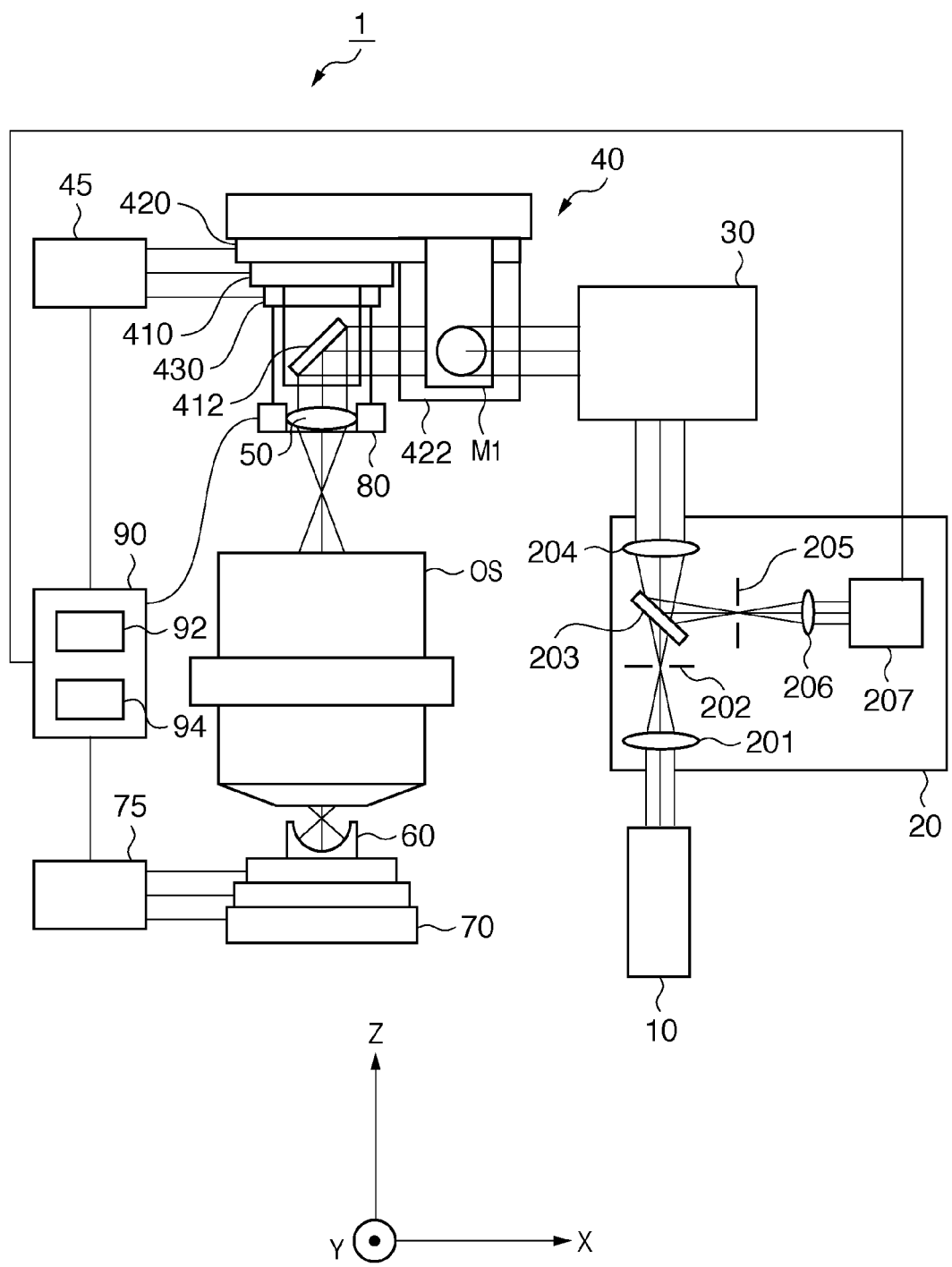
FIG. 1 is a schematic view showing a measurement apparatus according to one aspect of the present invention.

Embodiments of the present invention will be described below with reference to the accompanying drawings. Note that the same reference numerals denote the same members throughout the drawings, and a repetitive description thereof will not be given.

FIG. 1 is a schematic view showing a measurement apparatus 1 according to one aspect of the present invention. The measurement apparatus 1 measures the optical characteristics of a measurement target optical system OS (for example, a projection optical system for use in an exposure apparatus) and, in this embodiment, measures the wavefront aberration of the measurement target optical system OS.

The measurement apparatus 1 may include as a part of the apparatus certain optical components in a configuration of that is similar to that of a Fizeau interferometer, and/or may also have other components and configurations. The measurement apparatus 1 may also include as a part of the apparatus certain optical components having, for example, a configuration that is similar to a radial shearing interferometer, as well as other components and/or configurations.

As shown in FIG. 1, the measurement apparatus 1 includes a light source 10 and an interferometer unit 20 including a condenser lens 201, pinhole 202, half mirror 203, collimator lens 204, spatial filter 205, imaging lens 206, and CCD camera 207. The measurement apparatus 1 also includes a light extension optical system 30, TS stage 40, TS stage driving unit 45, TS lens 50, RS mirror 60, RS stage 70, RS stage driving unit 75, piezoelectric element 80, and control unit 90.

The light source 10 is that (for example, a laser light source) having high coherence and an oscillation wavelength close to the wavelength used in the measurement target optical system OS. Light from the light source 10 is split into test light and reference light in the light path by the TS lens 50 arranged on the side of the object plane of the measurement target optical system OS.

The test light (its light path) will be explained first. Light from the light source 10 is guided to the interferometer unit 20 and converged on the pinhole 202 by the condenser lens 201. Note that the diameter of the pinhole 202 is set to about ½ that of an airy disk, which is determined depending on the NA (numerical aperture) of the collimator lens 204. With this setting, the light from the pinhole 202 turns into an ideal spherical wave, is transmitted through the half mirror 203, is converted into collimated light by the collimator lens 204, and emerges from the interferometer unit 20.

The light emerging from the interferometer unit 20 is guided to the side of the object plane of the measurement target optical system OS by the light extension optical system 30, and enters the TS stage 40 including a TS X-stage 410, TS Y-stage 420, and TS Z-stage 430. The light from the interferometer unit 20 is reflected in the Y, X, and Z directions in the order named by a mirror M1 fixed on a stage base, a mirror 422 arranged on the TS Y-stage 420, and a mirror 412 arranged on the TS X-stage 410. The light reflected by the mirror 412 is converged on the object plane of the measurement target optical system OS by the TS lens 50 arranged on the TS Z-stage 430, is transmitted through the measurement target optical system OS, and forms an image on the image plane (wafer surface) of the measurement target optical system OS.

The light which has formed an image on the image plane of the measurement target optical system OS travels back almost the same light path running through the measurement target optical system OS, the TS lens 50, the mirrors 412, 422, and M1, and the light extension optical system 30 upon being reflected by the RS mirror 60 arranged on the RS stage 70, and enters the interferometer unit 20 as test light. Note that the RS mirror 60 has a reflective spherical surface which reflects the light having passed through the measurement target optical system OS, and can be set at an arbitrary image height in the measurement target optical system OS by the RS stage 70.

The test light which has entered the interferometer unit 20 is reflected by the half mirror 203 via the collimator lens 204, and converged on the spatial filter 205. The spatial filter 205 has a function of shielding stray light and steeply tilted wavefronts. The test light having passed through the spatial filter 205 enters the CCD camera 207 as nearly parallel light via the imaging lens 206.

The reference light (its light path) will be explained next. The reference light is light which enters the TS lens 50 from the interferometer unit 20 and is reflected by the TS lens 50. More specifically, light reflected by the Fizeau surface as the final surface of the TS lens 50 travels back almost the same light path as that of the test light, running through the mirrors 412, 422, and M1 and the light extension optical system 30, and enters the interferometer unit 20 as reference light. The reference light which has entered the interferometer unit 20 enters the CCD camera 207 as nearly parallel light via the collimator lens 204, half mirror 203, spatial filter 205, and imaging lens 206.

An interference pattern (interference fringes) is formed on the CCD camera 207 by interference (superposition) between the test light and the reference light, and detected by the CCD camera 207. At this time, the TS stage 40 and RS stage 70 can move the TS lens 50 and RS mirror 60 to an arbitrary image height in the measurement target optical system OS through the TS stage driving unit 45 and RS stage driving unit 75 under the control of the control unit 90. It is therefore possible to continuously measure the wavefront aberration of the measurement target optical system OS at an arbitrary image height. Note that the TS stage 40 also serves as a generation unit which drives the TS lens 50 in the optical axis direction of the measurement target optical system OS to change the phase difference between the test light and the reference light, thereby generating a plurality of phase states, as will be described later. However, it is also possible to drive the measurement target optical system OS in the optical axis direction to change the phase difference between the test light and the reference light, thereby generating a plurality of phase states.

The TS lens 50 can move in the optical axis direction of the measurement target optical system OS by the piezoelectric element 80 (fringe scanning unit) under the control of the control unit 90. The TS lens 50 is moved to change the phase difference between the test light and the reference light, thereby allowing high-accuracy wavefront measurement by the so-called fringe scanning method. Note that the fringe scanning method means a method of changing the phase difference between the test light and the reference light to change the contrast of the stripe pattern of interference fringes (to scan the stripe pattern of interference fringes), thereby obtaining the phase difference.

The interference pattern detected by the CCD camera 207 is sent to the control unit 90, and the wavefront of the measurement target optical system OS is calculated from a plurality of interference patterns obtained by fringe scanning.

The control unit 90 includes a CPU and memory (neither is shown) and controls the operation and process of the measurement apparatus 1. The control unit 90 particularly controls an operation and process associated with measurement of the wavefront aberration of the measurement target optical system OS by fringe scanning. In this embodiment, the control unit 90 includes a determination unit 92 which determines a nonlinear error (to be described later), and a correction unit 94 which corrects, based on the nonlinear error determined by the determination unit 92, the wavefront aberration of the measurement target optical system OS calculated from the interference pattern between the test light and the reference light. The determination unit 92 moves the TS lens 50 in the optical axis direction of the measurement target optical system OS in accordance with predetermined control data in the plurality of phase states generated by the TS stage 40. The determination unit 92 determines a nonlinear error representing a nonlinear change in feature amount with respect to the control data. The predetermined control data means herein control data for controlling driving of the piezoelectric element 80 so as to maintain the moving velocity of the TS lens 50 constant. However, the piezoelectric element 80 does not have a strictly linear response characteristic, so the moving velocity of the TS lens 50 does not become constant.

Figure 2:
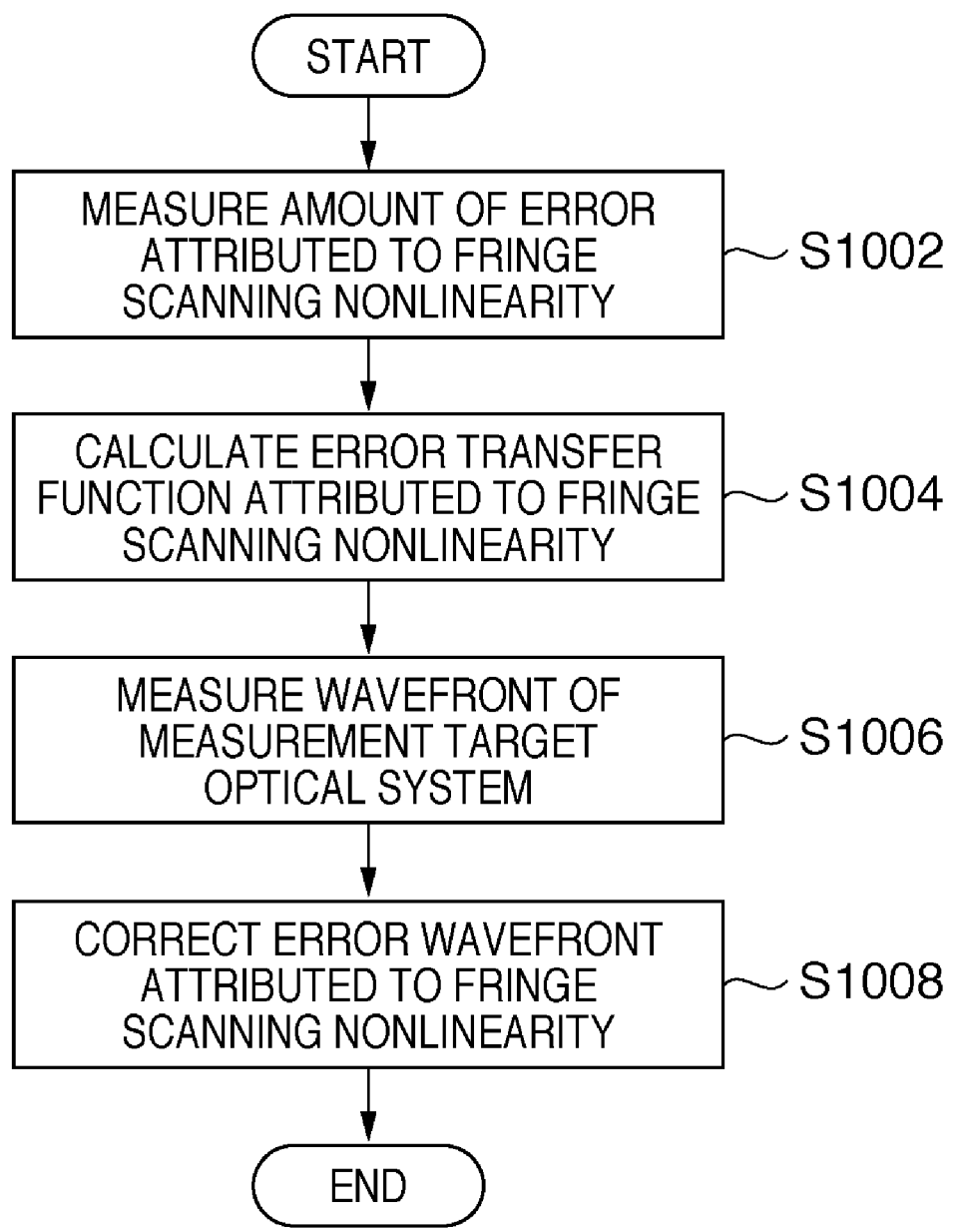
FIG. 2 is a flowchart for explaining a measurement method according to one aspect of the present invention.

A method of measuring the wavefront aberration of the measurement target optical system OS in the measurement apparatus 1 will be explained with reference to FIG. 2. This measurement method is executed by systematically controlling each unit of the measurement apparatus 1 by the control unit 90.

First, in step S1002, the amount of error attributed to fringe scanning nonlinearity (i.e., a change in the moving velocity of the TS lens 50) is measured. More specifically, the TS lens 50 is driven in the optical axis direction of the measurement target optical system OS through the TS stage 40 to change the distance (cavity length) between the measurement target optical system OS and the TS lens 50 (its Fizeau surface), thereby measuring the wavefront of the measurement target optical system OS at each cavity length. The wavefront of the measurement target optical system OS measured at each cavity length is expanded in a series of Zernike polynomials to calculate (derive) fluctuations in other Zernike terms with respect to the first Zernike term (piston) (changes in feature amounts derived from the interference pattern). Note that the cavity length is changed within unit wavelength (about 1λ) of light from the light source 10 so that the two-dimensional shape of the wavefront of the measurement target optical system OS can be considered the same throughout the measurement.

Fluctuations in other Zernike terms with respect to the piston will be explained herein. An error wavefront $\Delta W(x, y)$ attributed to fringe scanning is given by:

$$\Delta W(x, y) = \text{Cos Err}^* \cos(2^*(\theta(x, y)+\phi)) + \text{Sin Err}^* \sin(2^*(\theta(x, y)+\phi)) \quad (1)$$

where Cos Err is the cosine component of an error transfer function (a nonlinear error representing a nonlinear change in feature amount with respect to the control data) attributed to fringe scanning nonlinearity, Sin Err is the sine component of the error transfer function (the nonlinear error representing a nonlinear change in feature amount with respect to the control data) attributed to fringe scanning nonlinearity, $\theta$ is the measurement target phase at the pupil coordinates (x, y) in the measurement target optical system OS, and $\phi$ is the change in the measurement target phase (in this embodiment, the average phase (i.e., the piston) of the measurement target phases). Note that Cos Err and Sin Err are determined depending on fringe scanning nonlinearity and a fringe scanning algorithm (for example, a calculation method for converting the interference pattern detected by the CCD camera 207 into a phase). Hence, unless the fringe scanning nonlinearity and the fringe scanning algorithm are changed, Cos Err and Sin Err can be handled as constants.

Figure 3:
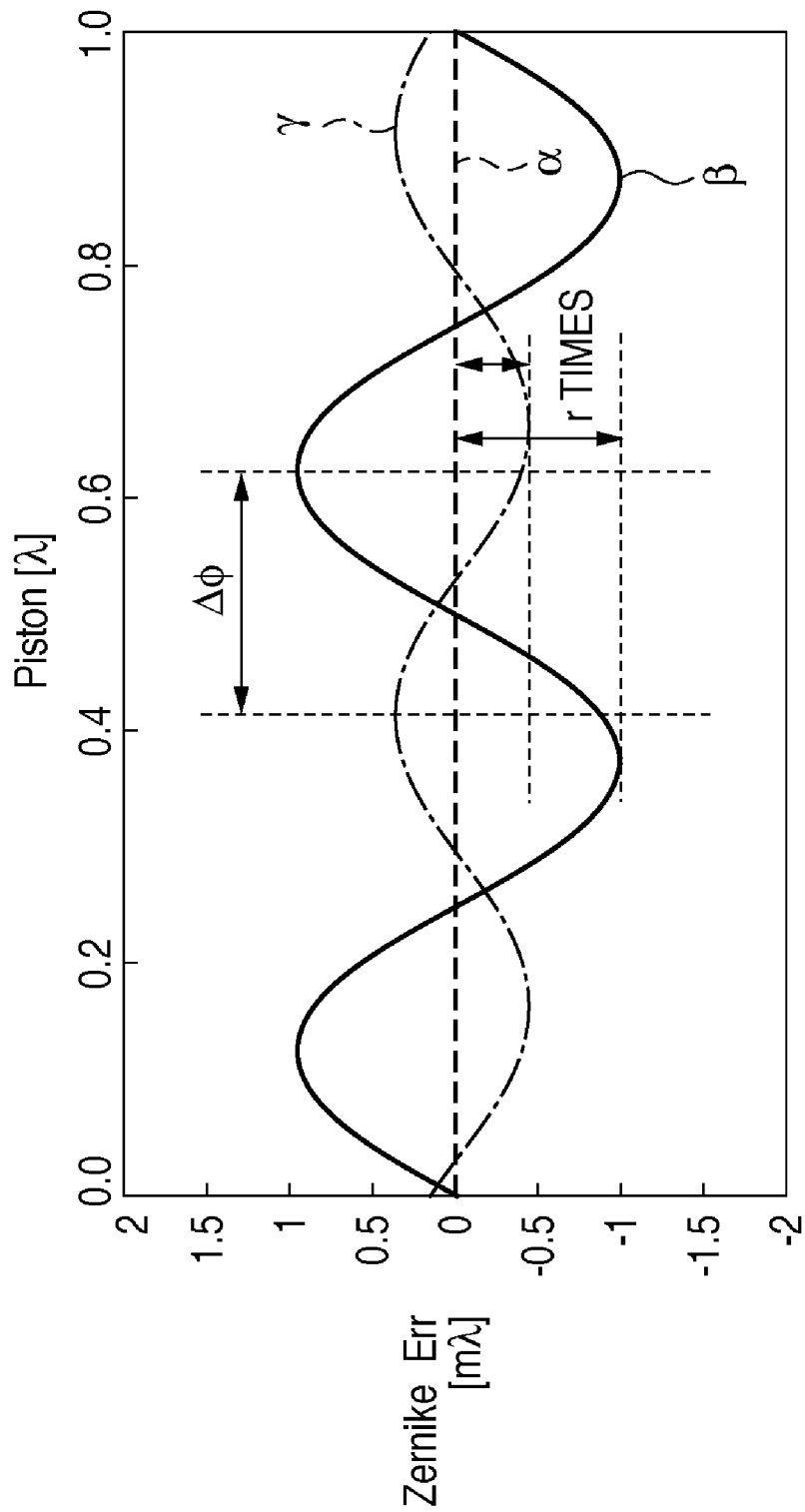
FIG. 3 is a graph showing the relationship between the average phase (piston) of the measurement target phases and a fluctuation in the Zernike term (an error attributed to fringe scanning nonlinearity).

For example, if fringe scanning has linearity, (if the moving velocity of the TS lens 50 stays constant), Cos Err and Sin Err are zero, and the error wavefront $\Delta W(x, y)$, in turn, is zero irrespective of the measurement target phase. Therefore, in this case, even when the measurement target phase is changed by changing the cavity length, no measurement error occurs and therefore no fluctuation in the Zernike term with respect to the average phase (piston) $\phi$ of the measurement target phases occurs, as indicated by α in FIG. 3. Note that FIG. 3 is a graph showing the relationship between the average phase (piston) of the measurement target phases and a fluctuation in the Zernike term (an error attributed to fringe scanning nonlinearity).

If fringe scanning has nonlinearity (if the moving velocity of the TS lens 50 changes), the error wavefront $\Delta W(x, y)$ changes as the measurement target phase changes. Therefore, in this case, when the measurement target phase is changed by changing the cavity length, a fluctuation in the Zernike term with respect to the average phase (piston) $\phi$ of the measurement target phases occurs, as indicated by β in FIG. 3. More specifically, when the measurement result at each cavity length is expanded in a series of Zernike polynomials, the Zernike term with respect to the average phase (piston) $\phi$ of the measurement target phases fluctuates periodically.

In step S1004, an error transfer function (nonlinear error) attributed to fringe scanning nonlinearity is calculated. More specifically, the values of Cos Err and Sin Err are tentatively determined (for example, Cos Err and Sin Err are assumed to be 1 and 0, respectively) assuming that the average of the two-dimensional shapes of the plurality of measurement target phases obtained in step S1002 is the true value of $\theta$. The error wavefront at a certain cavity length is calculated from equation (1), and expanded in a series of Zernike polynomials. This operation is performed for a plurality of cavity lengths. This makes it possible to obtain a fluctuation in the Zernike term, as indicated by γ in FIG. 3. It is therefore possible to obtain Cos Err and Sin Err from a fluctuation in the Zernike term measured actually (β in FIG. 3) and a phase difference $\Delta \phi$ and an amplitude ratio r calculated by tentatively determining the values of Cos Err and Sin Err. In this embodiment, a combination of Cos Err and Sin Err which matches a fluctuation in the Zernike term, indicated by β in FIG. 3, (i.e., a combination of them which satisfies a phase difference $\Delta \phi = 0$ and an amplitude ratio r=1) is obtained. In other words, a fluctuation in the Zernike term, as indicated by γ in FIG. 3, is calculated for each of various values of Cos Err and Sin Err, and a combination of Cos Err and Sin Err which satisfies a phase difference $\Delta \phi = 0$ and an amplitude ratio r=1 is obtained by adopting a least squares method.

In step S1006, the wavefront of the measurement target optical system OS is measured. More specifically, the TS lens 50 and RS mirror 60 are moved to an arbitrary image height in the measurement target optical system OS via the TS stage 40 and RS stage 70. The piezoelectric element 80 performs fringe scanning by moving the TS lens 50 in the optical axis direction of the measurement target optical system OS, and the wavefront of the measurement target optical system OS is calculated from a plurality of interference patterns detected by the CCD camera 207.

In step S1008, an error wavefront which is attributed to fringe scanning nonlinearity and included in the wavefront of the measurement target optical system OS measured in step S1006 is corrected. More specifically, an error wavefront is calculated using the wavefront of the measurement target optical system OS measured in step S1006, and Cos Err and Sin Err (the error transfer function (nonlinear error) attributed to fringe scanning nonlinearity) calculated in step S1004. The calculated error wavefront is subtracted from the wavefront of the measurement target optical system OS measured in step S1006 to obtain the wavefront aberration of the measurement target optical system OS.

In this manner, the measurement apparatus 1 according to this embodiment can accurately measure the wavefront aberration of the measurement target optical system OS by reducing measurement errors attributed to fringe scan nonlinearity. Note that Cos Err and Sin Err as the components of an error transfer function (nonlinear error) attributed to fringe scanning nonlinearity are determined depending on fringe scanning nonlinearity and a fringe scanning algorithm, as described above. Accordingly, unless the driving control and/or fringe scanning algorithm of the piezoelectric element 80 are changed, steps S1002 and S1004 need not be executed in measuring the wavefront of the measurement target optical system OS at, for example, the next image height. In other words, unless the driving control and/or fringe scanning algorithm of the piezoelectric element 80 are changed, steps S1006 and S1008 need only be repeated once an error transfer function (nonlinear error) attributed to fringe scanning nonlinearity is calculated.

Figure 4:
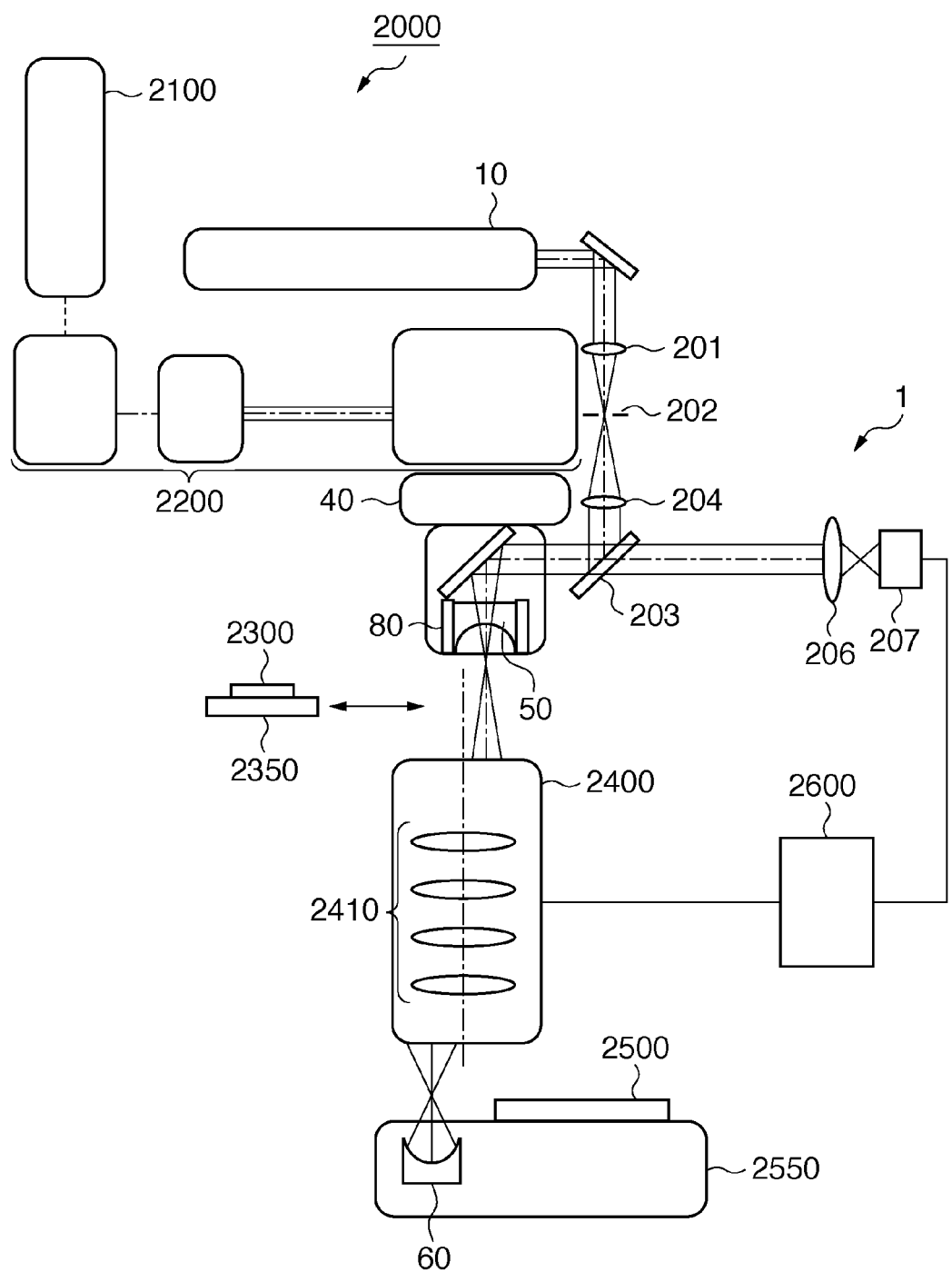
FIG. 4 is a schematic view showing an exposure apparatus according to one aspect of the present invention.

An exposure apparatus to which the measurement apparatus 1 is applied will be explained below. FIG. 4 is a schematic view showing an exposure apparatus 2000 according to one aspect of the present invention. Note that FIG. 4 shows only a light source 10, some components of an interferometer unit 20, a TS stage 40, a TS lens 50, an RS mirror 60, and a piezoelectric element 80 as constituent elements of a measurement apparatus 1. The measurement apparatus 1 may have the above-mentioned configuration in practice.

In this embodiment, the exposure apparatus 2000 is a projection exposure apparatus which transfers the pattern of a reticle onto a substrate such as a wafer by the step & scan scheme. However, the exposure apparatus 2000 can also adopt the step & repeat scheme or another exposure scheme.

The exposure apparatus 2000 includes a light source 2100, an illumination optical system 2200, a reticle stage 2350 which mounts a reticle 2300, a projection optical system 2400, a wafer stage 2550 which mounts a wafer 2500, the measurement apparatus 1, and a control unit 2600.

An excimer laser, for example, is used as the light source 2100. The excimer laser includes, for example, a KrF excimer laser having a wavelength of about 248 nm, and an ArF excimer laser having a wavelength of about 193 nm. However, the light source 2100 is not limited to an excimer laser, and may be, for example, an $F_2$ laser having a wavelength of about 157 nm.

The illumination optical system 2200 illuminates the reticle 2300 with light from the light source 2100, and includes, for example, a light extension optical system, beam shaping optical system, and incoherent optical system.

The reticle 2300 has a pattern (circuit pattern) to be transferred onto the wafer 2500, and is supported and driven by the reticle stage 2350. Diffracted light generated by the reticle 2300 is projected onto the wafer 2500 via the projection optical system 2400. Since the exposure apparatus 2000 is of the step & scan scheme, it transfers the pattern of the reticle 2300 onto the wafer 2500 by scanning them.

The reticle stage 2350 supports the reticle 2300 and is connected to a driving mechanism (not shown). The driving mechanism (not shown) includes, for example, a linear motor and drives the reticle stage 2350 in the X, Y, and Z directions and the rotation directions about the respective axes. In transferring the pattern of the reticle 2300 onto the wafer 2500, the reticle stage 2350 arranges the reticle 2300 on the object plane of the projection optical system 2400. In measuring the wavefront aberration of the projection optical system 2400, the reticle stage 2350 retracts the reticle 2300 from the object plane of the projection optical system 2400.

The projection optical system 2400 projects the pattern of the reticle 2300 onto the wafer 2500 and includes a plurality of optical elements 2410. The projection optical system 2400 can be a dioptric system, a catadioptric system, or a catoptric system. The plurality of optical elements 2410 can be driven in the optical axis direction (Z direction) and rotated about the optical axis by a driving mechanism (not shown) under the control of the control unit 2600. The wavefront aberration of the projection optical system 2400 can be adjusted by driving the plurality of optical elements 2410 in the optical axis direction or rotating them about the optical axis.

The wafer 2500 is a substrate onto which the pattern of the reticle 2300 is projected (transferred), and is coated with a photosensitive agent (resist). However, it is also possible to substitute the wafer 2500 by a glass plate or another substrate.

The wafer stage 2550 supports the wafer 2500 and drives it using, for example, a linear motor. The wafer stage 2550 also serves as the above-mentioned RS stage 70 by supporting and driving the RS mirror 60. In transferring the pattern of the reticle 2300 onto the wafer 2500, the wafer stage 2550 arranges the wafer 2500 on the image plane of the projection optical system 2400. In measuring the wavefront aberration of the projection optical system 2400, the wafer stage 2550 arranges the RS mirror 60 on the side of the image plane of the projection optical system 2400.

The measurement apparatus 1 measures the wavefront aberration of the projection optical system 2400 and sends the measurement result to the control unit 2600. The detailed configuration and operation of the measurement apparatus 1 are as above, and a detailed description thereof will not be given herein.

The control unit 2600 includes a CPU and memory (neither is shown) and controls the operation and process of the exposure apparatus 2000. Although the control unit 2600 also serves as the above-mentioned control unit 90 (the determination unit 92 and the correction unit 94) in this embodiment, a control unit 90 may be provided separately, as a matter of course. In this embodiment, the control unit 2600 also serves as an adjusting unit which adjusts the projection optical system 2400 based on the wavefront aberration of the projection optical system 2400 (the measurement result obtained by the measurement apparatus 1) sent from the measurement apparatus 1. More specifically, based on the measurement result obtained by the measurement apparatus 1, the control unit 2600 drives the optical elements 2410 of the projection optical system 2400 in the optical axis direction or rotates them about the optical axis via the driving mechanism (not shown) so as to optimize the wavefront aberration of the projection optical system 2400.

In the operation of the exposure apparatus 2000, the wavefront aberration of the projection optical system 2400 is measured by fringe scanning first. The wavefront aberration of the projection optical system 2400 is measured using the measurement apparatus 1, as described above. As the wavefront aberration of the projection optical system 2400 is measured, the projection optical system 2400 is adjusted based on the measurement result. The measurement apparatus 1 can accurately measure the wavefront aberration of the projection optical system 2400 by reducing measurement errors attributed to fringe scanning nonlinearity, as described above. Hence, the exposure apparatus 2000 can also accurately adjust the wavefront aberration of the projection optical system 2400.

Next, the pattern of the reticle 2300 is transferred onto the wafer 2500 by exposure. Light emitted by the light source 2100 illuminates the reticle 2300 by the illumination optical system 2200. The light which bears the information of the pattern of the reticle 2300 forms an image on the wafer 2500 by the projection optical system 2400. The projection optical system 2400 used in the exposure apparatus 2000 attains an excellent imaging capability because its wavefront aberration is adjusted accurately, as described above. Hence, the exposure apparatus 2000 can provide high-quality devices (e.g., a semiconductor device and a liquid crystal display device) with a high throughput and good economical efficiency. The devices are fabricated by a step of exposing a substrate (e.g., a wafer or a glass plate) coated with a resist (photosensitive agent) using the exposure apparatus 2000, a step of developing the exposed substrate, and other known steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-133546 filed on May 21, 2008, which is hereby incorporated by reference herein in its entirety.

What is claimed is:

1. A measurement apparatus which measures an aberration of a measurement target optical system, the apparatus comprising:
an optical element which is arranged on a side of an object plane of the measurement target optical system, and configured to split light from a light source into test light and reference light;
a generation unit configured to generate a plurality of phase states by changing a phase difference between the test light and the reference light;
a fringe scanning unit configured to perform fringe scanning by changing the phase difference between the test light and the reference light; wherein said fringe scanning unit further comprises a piezoelectric element for moving the optical element in an optical axis direction of the measurement apparatus;
a detector configured to detect an interference pattern between the test light and the reference light;
a determination unit configured to determine a nonlinear error representing a nonlinear relationship between control data of the piezoelectric element and a Zernike term of the aberration which is derived from the interference pattern formed in the plurality of phase states; and
a correction unit configured to correct, based on the nonlinear error determined by the determination unit, an aberration calculated from the interference pattern between the test light and the reference light to obtain an aberration of the measurement target optical system.

2. The apparatus according to claim 1, wherein the correction unit calculates an error wavefront, which changes depending on the nonlinear error, and subtracts the error wavefront from the aberration calculated from the interference pattern between the test light and the reference light.

3. The apparatus according to claim 1, wherein the generation unit changes a distance between the measurement target optical system and the optical element.

4. The apparatus according to claim 3, wherein the generation unit includes a driving mechanism configured to drive one of the measurement target optical system and the optical element in an optical axis direction of the measurement apparatus.

5. The apparatus according to claim 1, wherein the generation unit generates the plurality of phase states within unit wavelength of the light from the light source.

6. A measurement method of measuring an aberration of a measurement target optical system using a measurement apparatus including an optical element which is arranged on a side of an object plane of the measurement target optical system and splits light from a light source into test light and reference light, and a fringe scanning unit which performs fringe scanning by changing a phase difference between the test light and the reference light, wherein said fringe scanning unit further comprises a piezoelectric element for moving the optical element in an optical axis direction of the measurement apparatus the method comprising:
a generation step of generating a plurality of phase states by changing the phase difference between the test light and the reference light;
a detection step of detecting an interference pattern between the test light and the reference light;
a determination step of determining a nonlinear error representing a nonlinear relationship between control data of the piezoelectric element and a Zernike term of the aberration which is derived from the interference pattern formed in the plurality of phase states; and
a correction step of correcting, based on the nonlinear error determined in the determination step, an aberration calculated from the interference pattern between the test light and the reference light to obtain an aberration of the measurement target optical system.

7. An exposure apparatus comprising:
a projection optical system configured to project a pattern of a reticle onto a substrate;
a measurement apparatus configured to measure an aberration of the projection optical system; and
an adjusting unit configured to adjust the projection optical system based on the measurement result obtained by the measurement apparatus,
wherein the measurement apparatus includes
an optical element which is arranged on a side of an object plane of the projection optical system, and configured to split light from a light source into test light and reference light,
a generation unit configured to generate a plurality of phase states by changing a phase difference between the test light and the reference light,
a fringe scanning unit configured to perform fringe scanning by changing the phase difference between the test light and the reference light, wherein said fringe scanning unit further comprises a piezoelectric element for moving the optical element in an optical axis direction of the measurement apparatus;
a detector configured to detect an interference pattern between the test light and the reference light,
a determination unit configured to determine a nonlinear error representing a nonlinear relationship between control data of the piezoelectric element and a Zernike term of the aberration which is derived from the interference pattern formed in the plurality of phase states, and
a correction unit configured to correct, based on the nonlinear error determined by the determination unit, an aberration calculated from the interference pattern between the test light and the reference light to obtain an aberration of the projection optical system.

8. A device fabrication method comprising the steps of:
exposing a substrate using an exposure apparatus; and
developing the exposed substrate,
wherein the exposure apparatus includes:
a projection optical system configured to project a pattern of a reticle onto the substrate;
a measurement apparatus configured to measure an aberration of the projection optical system; and
an adjusting unit configured to adjust the projection optical system based on the measurement result obtained by the measurement apparatus,
wherein the measurement apparatus includes
an optical element which is arranged on a side of an object plane of the projection optical system, and configured to split light from a light source into test light and reference light,
a generation unit configured to generate a plurality of phase states by changing a phase difference between the test light and the reference light,
a fringe scanning unit configured to perform fringe scanning by changing the phase difference between the test light and the reference light, wherein said fringe scanning unit further comprises a piezoelectric element for moving the optical element in an optical axis direction of the measurement apparatus;

a detector configured to detect an interference pattern between the test light and the reference light, a determination unit configured to determine a nonlinear error representing a nonlinear relationship between control data of the piezoelectric element and a Zernike term of the aberration which is derived from the interference pattern formed in the plurality of phase states, and a correction unit configured to correct, based on the nonlinear error determined by the determination unit, an aberration calculated from the interference pattern between the test light and the reference light to obtain an aberration of the projection optical system.

* * * * *